United States Patent [19]
Bhatt

[11] Patent Number: 5,315,619
[45] Date of Patent: May 24, 1994

[54] CARRIER RECOVERY PROCESSOR FOR A QAM TELEVISION SIGNAL

[75] Inventor: Bhavesh B. Bhatt, Franklin Park, N.J.

[73] Assignee: RCA Thomson Licensing Corporation, Princeton, N.J.

[21] Appl. No.: 883,735

[22] Filed: May 15, 1992

[51] Int. Cl.$^5$ .................. H04L 5/12; H04L 23/02
[52] U.S. Cl. ........................ 375/94; 348/475
[58] Field of Search .................. 375/39, 88, 94; 358/141, 13, 181; 370/20, 77, 100.1

[56] References Cited

U.S. PATENT DOCUMENTS 5,113,142 5/1992 Yoshikawa .................. 375/39
5,148,272 9/1992 Acampora et al. .............. 358/141

OTHER PUBLICATIONS

Jablon, Neil K. "Joint Blind Equalization, Carrier Recovery, and Timing Recovery for High-Order QAM Signal Constellations," IEEE Trans. on Signal Processing, vol. 40, No. 6 Jun. 1992 pp. 1383-1398.
Cupo; Robert L. and Gitlin, Richard D. "Adaptive Carrier Recovery Systems for Digital Data Communications Systems" IEEE Journal on Sel. Areas in Communications, vol. 7, No. 9, Dec. 1989, pp. 1328-1339.
Lee et al., "Digital Communication", Kluwer Academic Press, Boston, Mass., 1988, pp. 553-554.

Primary Examiner—Stephen Chin
Assistant Examiner—Bryan Webster
Attorney, Agent, or Firm—Joseph S. Tripoli; Eric P. Herrmann; Ronald H. Kurdyla

[57] ABSTRACT

A television receiver responds to a quadrature amplitude modulated (QAM) signal containing symbols mapped into a four quadrant grid-like constellation defined by I and Q axes. Demodulated I and Q components are processed by a carrier recovery network which adjusts the parameters of a locally generated carrier reference signal so as to maintain a desired orientation of the QAM constellation. The carrier recovery network includes a time multiplexed processor, including a signal multiplier, exhibiting plural operating modes in a digital phase locked loop exhibiting a loop delay of one symbol period.

14 Claims, 6 Drawing Sheets

CARRIER RECOVERY PROCESSOR FOR A QAM TELEVISION SIGNAL

FIELD OF THE INVENTION

This invention concerns apparatus for processing a quadrature amplitude modulated (QAM) television signal.

BACKGROUND OF THE INVENTION

In a QAM symbol transmission system of the type disclosed herein, in-phase "I" and quadrature phase "Q" signal components modulate respective cosine and sine carriers. A data symbol being transmitted is represented by both I and Q components. Each symbol may represent several bits, and the number of bits/symbol dictates the type of QAM system, i.e., 16 QAM, 32 QAM, etc. Each symbol is mapped into a prescribed location in a four quadrant grid-like constellation using a look-up table, with a prescribed number of symbols occupying assigned areas in each quadrant. Thus in a 32 QAM system each quadrant of the constellation contains 8 symbols at prescribed locations with respect to in-phase and quadrature phase I and Q axes. A form of differential coding may be used whereby certain bits designate the constellation quadrant in which the symbol is located, and certain bits designate the particular point in that quadrant assigned to the symbol. QAM systems of the type described are well known.

At a receiver, the QAM modulated carrier frequency may be offset relative to a carrier reference signal locally generated at the receiver. This carrier frequency offset is typically manifested by a dynamic rotation of the QAM constellation recovered at the receiver, and may be significantly reduced or eliminated by means of a phase locked loop (PLL) network. The PLL generates a frequency/phase correction signal for dynamically restoring (derotating) the QAM constellation to a correct orientation with the symbols in expected locations. A second order PLL is often preferred for correcting the described carrier offset since a second order PLL exhibits a wide tracking range for correcting a wide frequency deviation, e.g., up to a 60 KHz deviation for example, and typically is able to correct such deviation completely.

The stability of the PLL is a function of both loop delay as determined by the number of clock cycles in a digital phase locked loop (DPLL), and loop gain. High loop gain, is generally desirable but often degrades the stability of the loop. In addition, for a given gain, loop stability decreases as the number of clock cycles (delays) increases. Apparatus according to the present invention addresses this compromise involving loop delay and loop gain in a carrier recovery system.

SUMMARY OF THE INVENTION

A carrier recovery system according to the principles of the present invention employs a time multiplexed plural operating mode processor for compensating for a carrier frequency offset. In an illustrated preferred embodiment, the processor includes a signal multiplier in a second order phase locked loop, and exhibits a minimum loop delay of one symbol period (one symbol clock cycle). Compensation is provided for a carrier frequency offset in a system for processing a carrier QAM modulated with high priority information in a spectrum also including a second carrier modulated with lower (standard) priority information.

DETAILED DESCRIPTION

Figure 1:
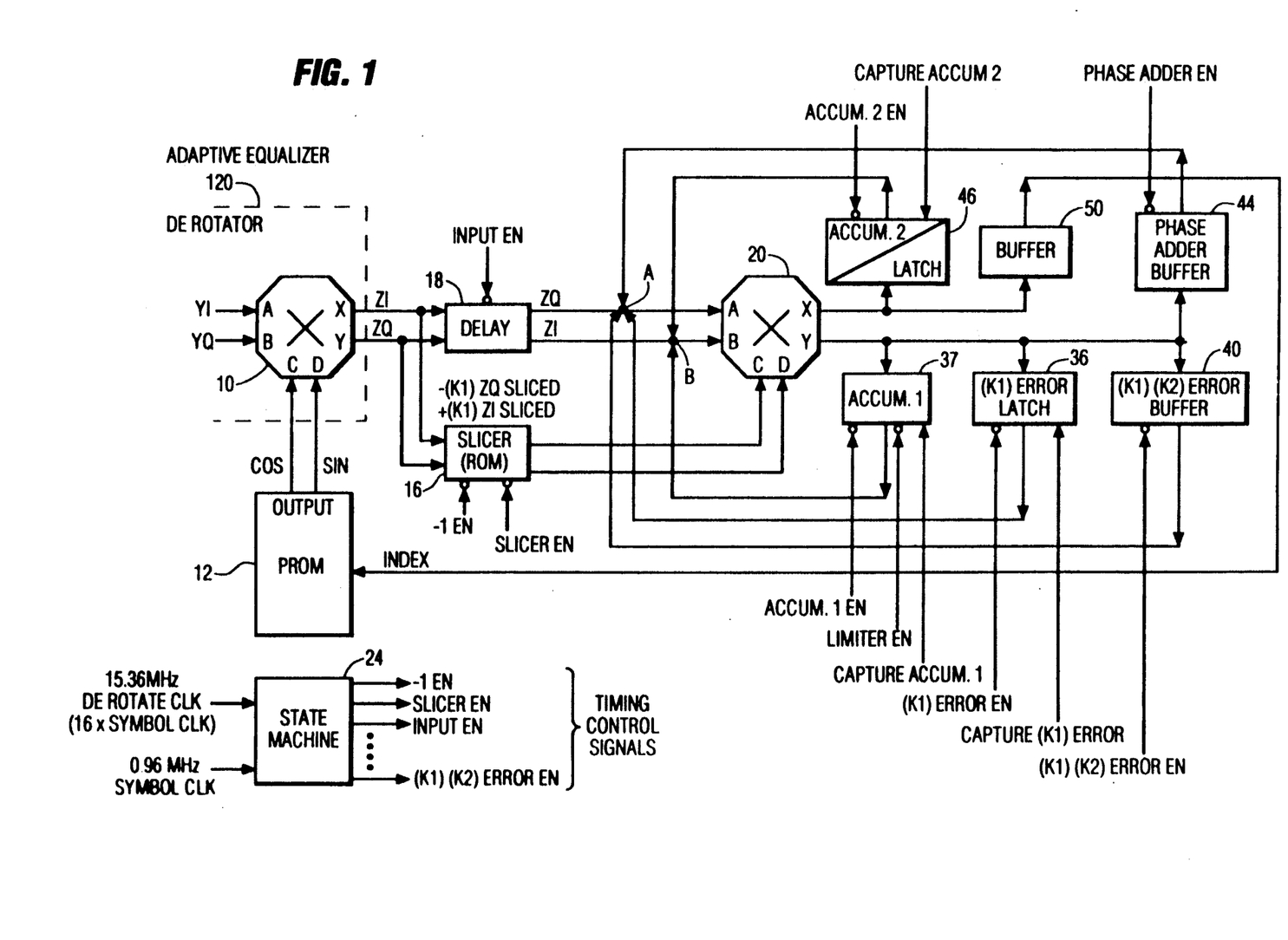
FIG. 1 is a block diagram of carrier recovery apparatus for in a television signal receiver according to the principles of the present invention.

In FIG. 1, a portion of an adaptive equalizer 120 includes a QAM constellation derotator section with an associated multiplier 10, in a high definition television receiver as will be discussed in connection with FIG. 4. Multiplier 10 receives quadrature phased signal components I and Q from QAM adaptive equalizer filters (not shown). These components are designated as YI and YQ inputs to multiplier 10, which also receives sin and cos quadrature phased input reference signals from an output of a PROM 12. An input QAM constellation defined by input signals YI and YQ is dynamically rotated to a correct position, as necessary, in response to the output reference signals from PROM 12, producing corrected output QAM signals ZI and ZQ. The amount of rotation (derotation) required to produce a correct orientation of the QAM constellation at the output of multiplier 10 is a function of a dynamically varying phase error representative signal INDEX applied to an address input of PROM 12. The INDEX signal is developed by a second order DPLL as will be discussed, and is formatted so as to correspond to sin/cos look-up table addresses associated with sin and cos output values needed to reduce detected phase error to substantially zero when the sin/cos output values are applied to multiplier 10.

PROM 12 and multiplier 10 comprise a second order digital phase locked loop (DPLL) for eliminating a dynamically varying frequency and phase offset between a transmitted QAM carrier and a locally generated reference signal nominally at the carrier frequency. The amount of offset is manifested by the amount of dynamic rotation of the QAM constellation appearing at the output of multiplier 10 before correction by a carrier recovery DPLL circuit including a slicer 16, multiplier 20 and associated circuit elements which coact with PROM 12 as will be discussed. Multiplier 20 may be the Plessey type PDSP 16116A complex multiplier, which conveniently provides the necessary four-input multiplier function. A complex multiplier per se is not essential.

Figure 4:
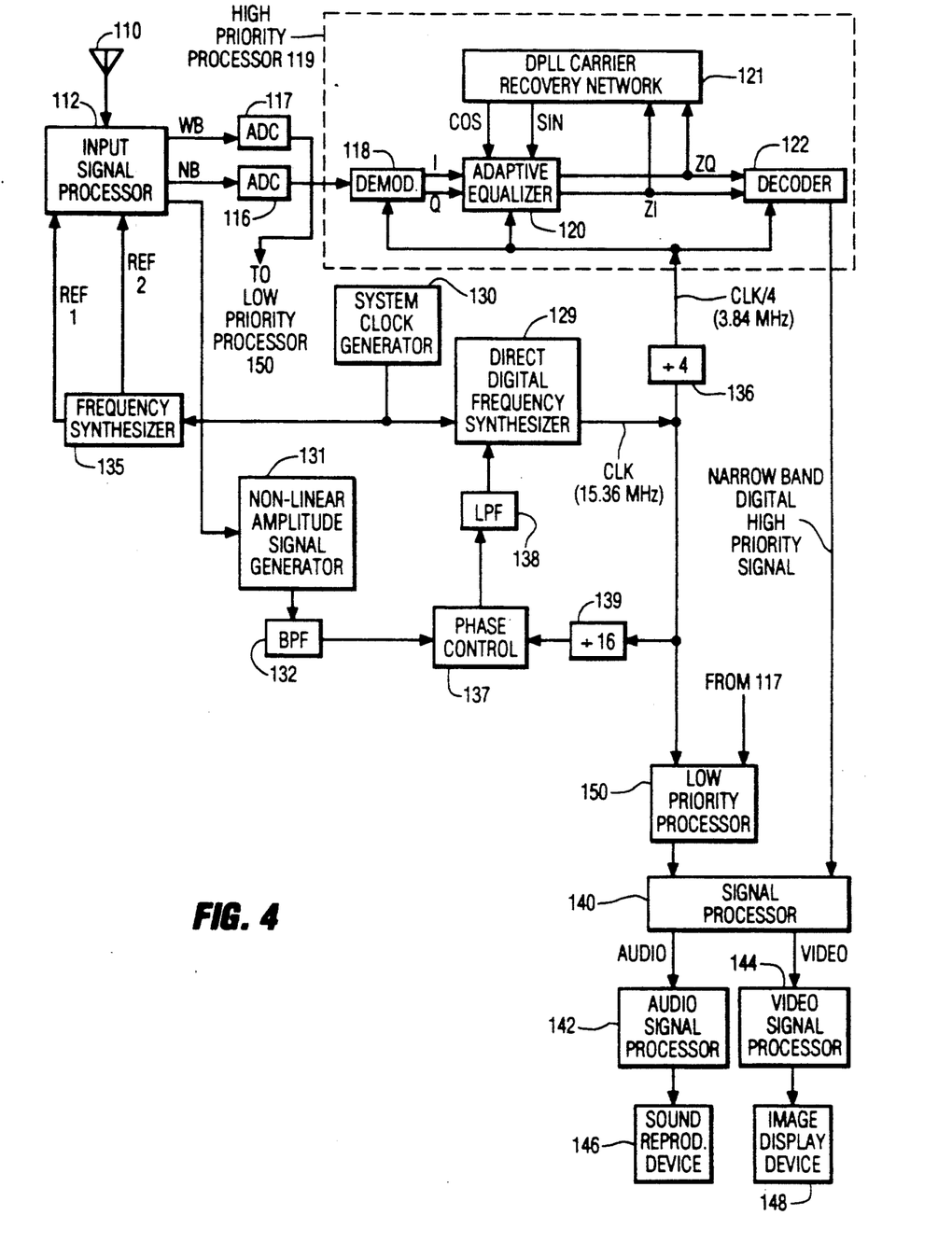
FIG. 4 is a block diagram of a portion of a high definition television receiver including the apparatus of FIG. 1.

The carrier recovery circuit is disclosed in the context of an HDTV receiver using a narrowband signal processor for processing high priority information, and a wideband signal processor for processing lower priority, e.g., standard priority information, as will be shown in greater detail in FIG. 4. The carrier recovery network in the narrowband signal processor uses a DPLL clocked at 15.36 MHz, which is 16 times the 0.96 MHz symbol rate of the narrowband QAM information channel. The carrier recovery network in the wideband processor uses a DPLL clocked at 4 times the symbol rate of the wideband QAM information channel.

The DPLL in the narrowband high priority processor advantageously exhibits a loop delay which does not exceed one symbol period, i.e., one symbol clock cycle. The DPLL used with the wideband low (standard) priority processor exhibits a loop delay of four symbol periods (clock cycles). Multiplier 20 is clocked to operate in a multiplexed mode in order to avoid long loop delays which may require performance degrading reduced loop gain to maintain loop stability.

The multiplexed multiplier network performs several operations during each operating cycle, within a single symbol period. These include: (I) calculating a dynamically variable phase error, (II) accumulating a value equal to the product of the phase error and prescribed gain factors K1 and K2, (III) adding the accumulated value to a previously determined product value K1×phase error, and (IV) a final accumulation (integration). Gain factor K1 is embedded in the operation of a slicer 16 preceding multiplexed multiplier 20. Gain K2 is provided by shifting the multiplicand sample bits to positions of lesser bit significance. Shifting the sample bits by 1, 2 or 3 positions of lesser significance corresponds to multiplication by a fraction, e.g., $\frac{1}{2}, \frac{1}{4}, \frac{1}{8}, \ldots$ etc.

Gain K1 is a constant gain factor based upon experimentally determined considerations of bandwidth, loop stability, and desired noise characteristics, for example. Gain K2 is also a constant based upon similar considerations. Gain K2 is associated with the second order path of the DPLL, and is achieved by shifting bits rather than by a more complex multiplier approach. Gain K2 is produced by an incremental shift to the right in the bitstream, where multiplying by $\frac{1}{2}$ is achieved by a one bit shift, by $\frac{1}{4}$ is achieved by a two bit shift, by $\frac{1}{8}$ is achieved by a three bit shift, etc.

A state machine 24, essentially a timing signal generator, develops a plurality of timing control signals for enabling or disabling data to the four 16-bit inputs of multiplier 20 so as to permit multiplexed operation of multiplier 20. Multiplier 20 includes two input pairs AB and CD, and a pair of outputs X,Y. Inputs A and C correspond to "real" axes inputs, and inputs B, D correspond to "imaginary" axes inputs. Outputs X and Y respectively correspond to "real" and "imaginary" axes outputs. Thus multiplier 20 performs the function $(A+jB)(C+jD)=X+jY$. State machine 24 is basically a high speed sequencer clocked at 15.36 MHz, which is 16 times the 0.96 MHz symbol clock, and produces gray coded output signals for enhanced noise immunity. Plural output timing control signals from state machine 24 are applied to respective timing control inputs of slicer 16 (−1 EN and SLICER EN), delay unit 18 (INPUT EN), accumulator 2 and latch unit 46 (ACCUM. 2 EN and CAPTURE ACCUM. 2), buffer 44 (PHASE ADDER EN), accumulator 1 in unit 37 (ACCUM. 1 EN and CAPTURE ACCUM. 1), and buffer 40 ((K1)(K2)ERROR EN)).

Figure 3:
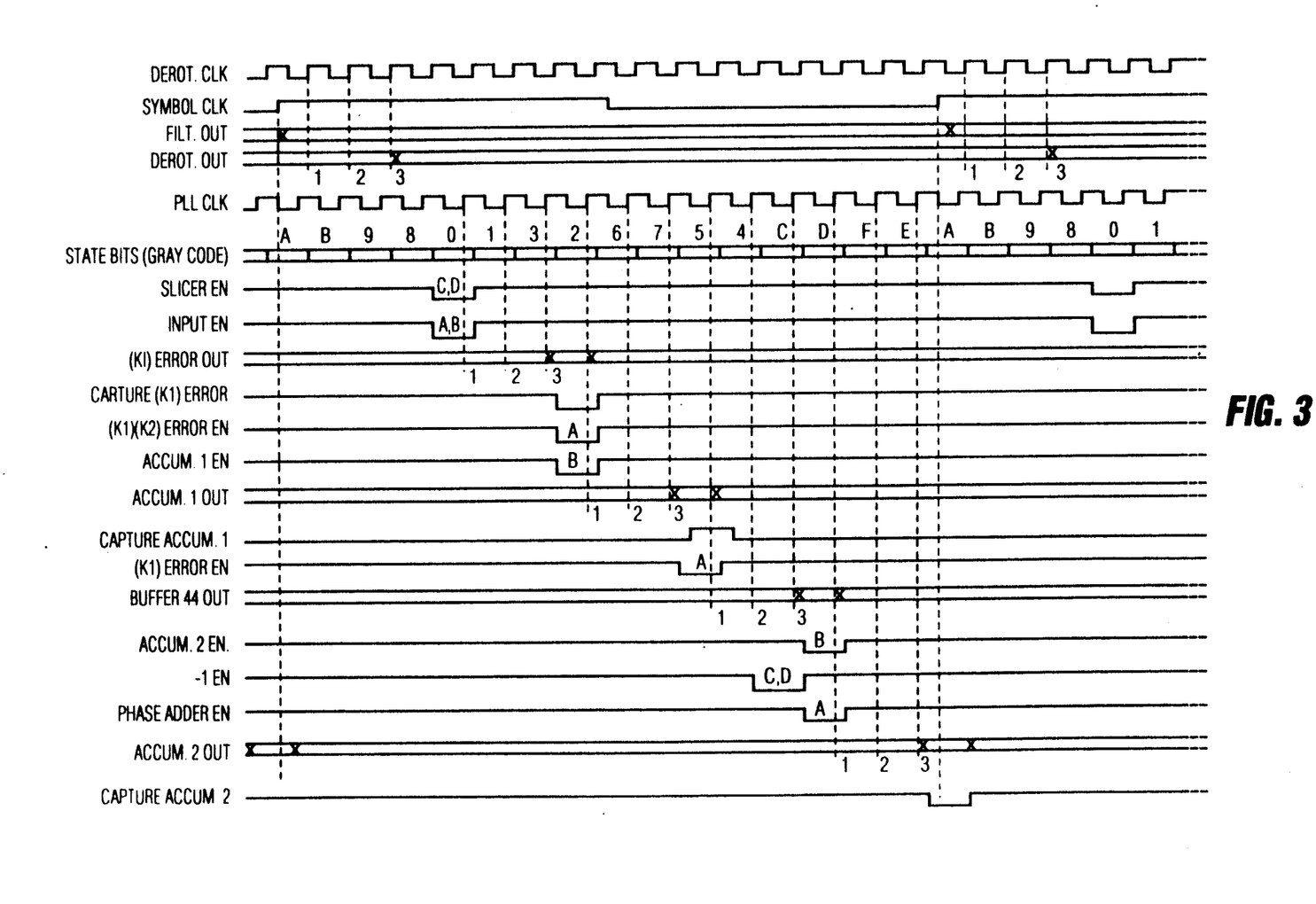
FIG. 3 illustrates signals related to the operation of the apparatus of FIGS. 1 and 2.

FIG. 3 is a timing diagram for the various timing control signals shown in FIG. 1. A small circular element at the timing control signal inputs in FIG. 1 designates an active low whereby the control function is performed in response to a low logic level. Pairs of "X" symbols in the timing diagrams signify that data is valid between horizontally paired X symbols. The DEROT CLK applied to state machine 24 and the PLL CLK for the system are similar but mutually phase shifted, both being 16 times the symbol clock. FILT OUT refers to the outputs of filters (not shown) preceding multiplier 10 in FIG. 1 for providing signals YI and YQ. The GRAY CODE STATE BITS are also shown. Other items illustrated in FIG. 3 correspond to signal conditions which will be referred to in the subsequent discussion.

In FIG. 1, slicer 16 selects or "slices out" the 5-bit symbols from the five most significant bits (MSB) of 16-bit signals ZI and ZQ from multiplier 10, and provides the sliced symbols to a ROM associated with slicer 16. If after examining the quadrant and point locator bits a symbol is found to be offset from an expected location within the I, Q constellation, the symbol will be placed at the expected location as specified by the expected constellation symbol locations programmed in the ROM. For each input symbol represented by received signals ZI and ZQ on a set of I, Q orthogonal axes, the ROM generates a corresponding output symbol at a programmed location which is closest to the input symbol location. If the input symbol is at the expected location, no error exists and the output symbol from the slicer ROM will correspond to the input symbol at its location. However, if the input symbol is not at the expected location, the location of the output symbol generated by the ROM and the location of input symbol (ZI, ZQ) will differ by an error factor. This error factor, a phase error, is detected by multiplier 20 in response to the ZQ, ZI input symbol data at inputs A and B respectively, and the symbol data as developed by the slicer ROM and applied to multiplier inputs C and D.

Gain factor K1 is provided by a look-up table associated with slicer 16. Delay 18, which may be provided by a pipeline latch, is enabled by an INPUT EN signal from state machine 24. Delay 18 compensates for delays incurred in slicer 16, ensuring that signals arrive at inputs A, B, C and D of multiplier 20 in proper synchronism.

Slicer 16 responds to enabling signals −1 EN and SLICER EN from state machine 24. The latter control signal enables slicer 16 to process the signals from multiplier 10. The −1 EN signal forces the slicer output lines coupled to inputs C, D of multiplier 20, to a −1 level (in 16 bit 2's complement form). Thus slicer 16 provides input C of multiplier 20 with a sliced ZQ signal multiplied by gain factor K1, with a negative sign, i.e., −(K1)ZQ SLICED. Similarly, slicer 16 provides input D of multiplier 20 with a positive sliced ZI signal multiplied by gain K1, i.e., +(K1)ZI SLICED.

Figure 2:
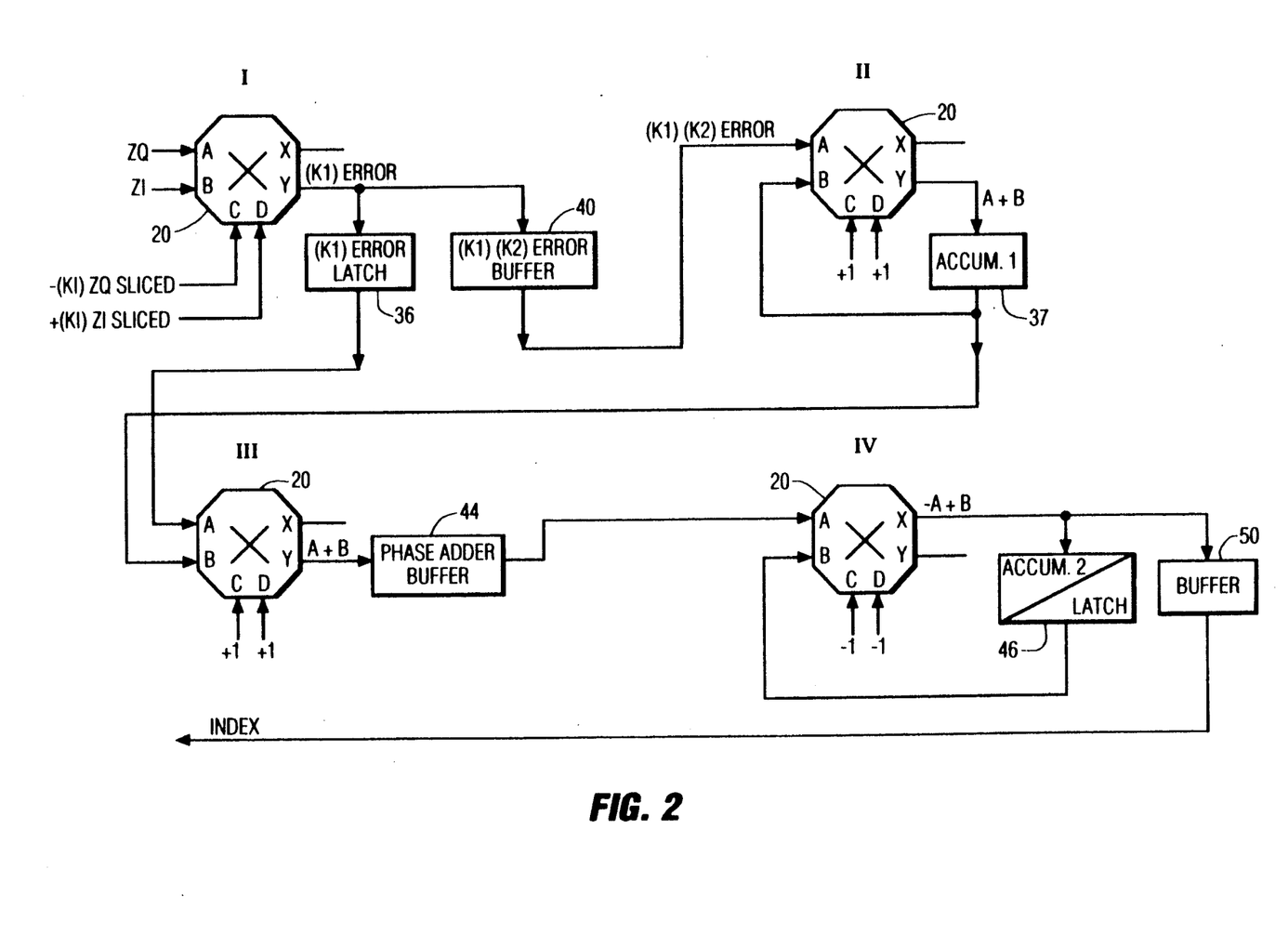
FIG. 2 is a representation of operating states of a multiplexed multiplier element of the apparatus shown in FIG. 1.

The following description of the DPLL operation considers both FIGS. 1 and 2. FIG. 2 depicts the four operating states I–IV of multiplier 20 for a given multiplexing cycle, which is completed within one symbol (clock) period as can be seen from FIG. 3. Elements common to FIGS. 1 and 2 are identified by the same reference number.

Referring to FIG. 2, a phase error is determined during initial state I, which begins with gray code state 0 (FIG. 3). Inputs A and B of multiplier 20 receive symbol components ZQ and ZI respectively. Multiplier inputs C and D are enabled to receive sliced, translated versions of components ZQ and ZI from slicer 16 as discussed. A signal appearing at multiplier output Y represents the phase error for each symbol, as determined by the expression (A)(D)+(B)(C) where A, B, C, D designate the signals appearing at the similarly labeled input terminals of multiplier 20. Thus the signal at output Y is K1[(ZQ)(ZI SLICED)−(ZI)(ZQ SLICED)]. The bracketed component represents the phase error, so that the signal at output Y may be abbreviated as (K1)ERROR. This error signal is captured (stored) by a latch 36, and is also passed through a network 40 which imparts gain K2 to this signal, generating error signal (K1)(K2) ERROR. Network 40 also includes an output buffer. This completes state I of the multiplexing cycle.

State II accumulates the (K1)(K2) ERROR signal and commences with gray code state 2. At the beginning of state II, the error signal (K1)(K2) ERROR from unit 40 is coupled to input A of multiplier 20, and the value stored in accumulator 1 (of unit 37) is coupled to input B of multiplier 20. An enabling +1 signal (a 16-bit word) is applied to both multiplier inputs C and D from slicer 16. The signal appearing at output Y of multiplier 20 is the sum of the signals appearing at inputs A and B of multiplier 20 (recall that output Y provides a signal equal to (A)(D)+(B)(C), and C and D are both "+1" or this state). The sum signal at output Y is stored by accumulator 1 of unit 37. This ends state II.

In state III, which begins with gray code state 5, the output of accumulator 1 is added to error signal (K1) ERROR. The newly accumulated value in accumulator 1 (of unit 37) is coupled to input B of multiplier 20, and signal (K1) ERROR, which was captured previously during state I, is applied to input A. Enabling +1 signals are applied to multiplier inputs C and D from slicer 16. The signal appearing at output Y of multiplier 20 is equal to the sum of the signals appearing at multiplier inputs A and B. This output signal is conveyed via a buffer 44.

Final state IV begins with gray code state D and performs a final accumulation. Buffer 44 conveys the signal from output Y of multiplier 20 developed during the previous state to multiplier input A, accumulator 2 of unit 46 is enabled so that its contents are coupled to multiplier input B, and multiplier inputs C and D are enabled with −1 signals from slicer 16. Output X of multiplier 20 is defined by −A+B, where A and B refer to the signals appearing at the respective A and B multiplier inputs. This output signal is accumulated by accumulator 2 of unit 46 and captured by the latch of unit 46, and is coupled via a buffer 50 to the INDEX input of PROM 12 (FIG. 1) to produce a correct sin/-cos phase and thereby a phase corrected (derotated) QAM constellation. This completes a multiplex operating cycle of multiplier 20 and the associated PLL elements, which as can be seen from FIG. 3 occurs within one symbol clock period, i.e., within one symbol period. The accumulated values are not reset at the end of each multiplexing cycle. As the phase error varies slowly with time the accumulated values also vary slowly with time. When the Plessey type PDSP 16116A multiplier is used for multiplier 20, the multiplier inputs and outputs are separated by three clock edges, as indicated by numerals 1, 2, 3 in the timing diagrams.

The plural mode multiplexed operation discussed in connection with FIGS. 1 and 2 performs operations including phase detection and phase error calculation, loop filtering and reference signal generation. In the disclosed system the phase error is determined during state I, and second order loop filtering is performed by operations associated with states I, II and III. The second order loop filter response is given by the expression $K1+K2/(1−Z^{−1})$, where K1 and K2 are the gain factors discussed previously, and $Z^{−1}$ represents a one clock period delay. The loop filter response is essentially a low pass response for smoothing the feedback control signal. The operation of multiplier 20 in state IV together with PROM 12 generates the phase control reference signals, such as may be provided by a complex voltage controlled oscillator (VCO) in a conventional phase locked loop. Such a conventional phase locked loop for carrier recovery purposes is described in the text Lee and Messerschmidt, "Digital Communication" (Kluwer Academic Press, Boston, Mass., 1988).

Figure 5:
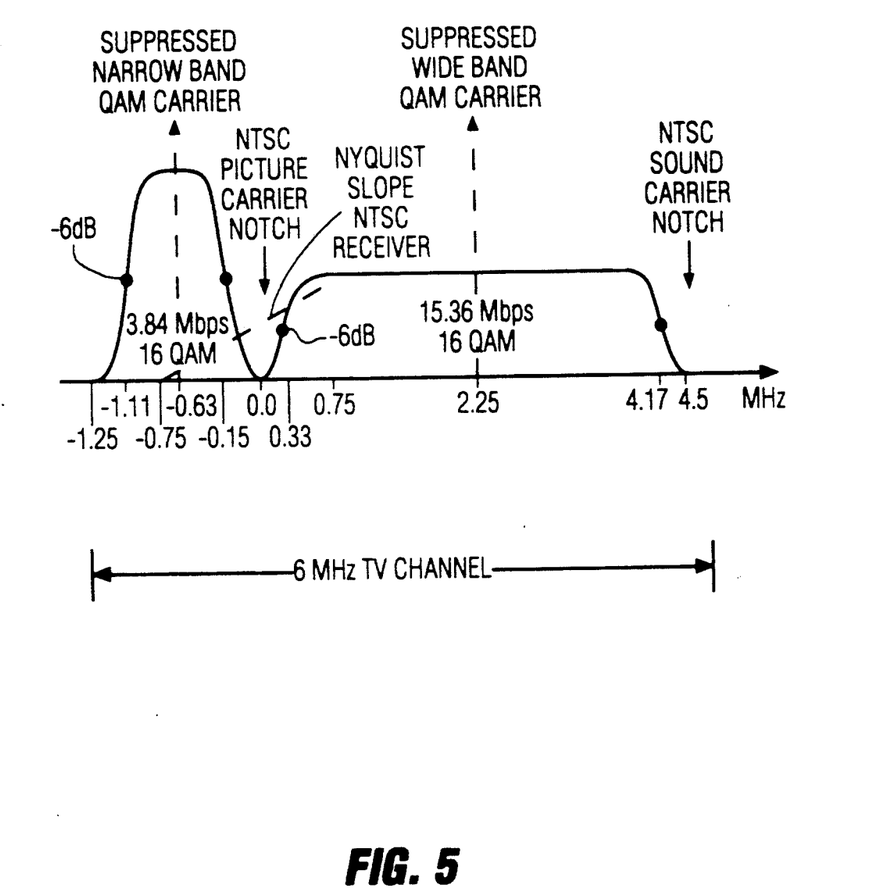
FIG. 5 depicts the video signal spectrum of a multiple QAM high definition television signal received by the system of FIG. 4.

The DPLL carrier recovery apparatus of FIGS. 1 and 2 is shown as block 121 in the HDTV receiver system of FIG. 4. An input signal to the receiver exhibits a spectrum as shown in FIG. 5. Specifically, FIG. 5 illustrates the video frequency spectrum of a high definition television signal which is compatible with the 6 MHz bandwidth of a standard NTSC television signal channel, and which may be used as a simulcast signal. The frequencies along the frequency scale of FIG. 5 (−1.25 MHz to 4.5 MHz) are referenced to the 0.0 MHz frequency location of the RF picture carrier in a standard NTSC system.

The HDTV television signal is a data compressed signal divided into high and low priority (i.e., standard priority) information components. In this example audio, synchronizing and low frequency video information components that are intended to be received with high reliability are assigned a high priority. The synchronizing information, for example, may be in the nature of a training signal containing a unique signature or code to facilitate signal recovery and processing at a receiver, and illustratively may include field rate scanning information (e.g., start of field markers). Other less critical components, such as high frequency video information, are assigned a lower priority. The high priority information exhibits a narrow bandwidth relative to the low priority information, and narrowband quadrature amplitude modulates (QAM) a 0.96 MHz carrier. The low priority information wideband quadrature amplitude modulates a 3.84 MHz carrier. A resulting composite signal is a form of a multiple QAM signal, i.e., a "twin" QAM signal in this instance. The composite twin QAM signal has been translated into the 6 MHz standard television band by means of appropriate frequency translation at the transmitter, resulting in the spectrum shown in FIG. 5.

The amplitude of the narrowband QAM component is significantly greater than that of the wideband QAM component, twice as large in this example. The −6 db bandwidth of the narrowband QAM component is 0.96 MHz, and the −6 db bandwidth of the wideband QAM component is 3.84 MHz, or four times the bandwidth of the narrowband QAM component. The nonlinear band edge transition regions of the narrowband and wideband QAM components are shaped by finite impulse response (FIR) filters with a square root of a raised cosine characteristic, to produce smooth transition regions which avoid unwanted high frequency effects produced by sharp transition regions. The narrowband component exhibits an amplitude-versus-frequency characteristic with an excess bandwidth of approximately 17%, i.e., 17% more than the theoretical minimum bandwidth defined by the expression $\frac{1}{2}\times(1/T)$ where T is the symbol period for the subject signal. The amplitude-versus-frequency response of the wideband component in the band edge transition regions (not drawn to scale) has one quarter the slope of the steeper narrowband component.

The narrowband and wideband QAM components each contain an in-phase component "I" and a quadrature-phase component "Q". The I-phase component modulates a suppressed cosine carrier, and the Q-phase component modulates a suppressed sine carrier. A data "symbol" is represented by both the I component and the Q component. In the case of a 32 QAM signal, each I and Q component exhibits 32 possible amplitude levels, or values, for each of the narrowband and wideband QAM signals, hence "32" QAM. Two bits are needed to specify the levels of each I and Q component, whereby each data symbol requires five bits to specify the 32 levels for an I, Q combination. Thus the bit rate of the 3.84 MHz (−6 db) wideband QAM signal is 19.2 Mbps (3.84 MHz×5 bits), and the bit rate of the 0.96 MHz (−6 db) narrowband QAM signal is 4.8 Mbps (0.96 MHz×5 bits). The described multiple (twin) QAM signal exhibits significant co-channel immunity from interference associated with a standard NTSC television signal, i.e., an NTSC signal transmitted from a different location in the same channel as the twin QAM signal. Co-channel interference from the twin QAM signal into an NTSC signal also is reduced significantly.

The bit rates of the wideband and narrowband QAM signals, 15.36 Mbps and 3.84 Mbps respectively, advantageously exhibit a 4:1 integer relationship. This relationship simplifies recovering the narrowband and wideband QAM information at a receiver, since the same derived data clock can readily be used for timing the data recovery operation of both QAM components. The required data clock rates for the receiver system can be easily derived from the readily recovered high power narrowband QAM signal.

In the receiver system of FIG. 4, a broadcast twin QAM signal received by an antenna 110 is applied to an input signal processor 112 including RF and IF stages. Processor 112 also receives reference signals REF 1 and REF 2 corresponding in frequency to reference signals used at the transmitter for developing the transmitted signal. Output signals from processor 112 include a wideband QAM component (WB) and a narrowband QAM component (NB) which are conveyed via respective analog-to-digital converters 117 and 116 to a high priority processor 119 and a low priority processor 150. The signal processed by processor 112 exhibits the composite modulation frequency spectrum shown in FIG. 5.

Reference signals REF 1 and REF 2 are locally generated in the receiver, and it may happen that these reference signals are not identical to corresponding carrier signals generated at the transmitter. Thus wideband and narrowband output signals WB and NB from unit 112 may exhibit a carrier offset, which is manifested by dynamic rotation of the QAM constellation. This effect is corrected by DPLL carrier recovery network 121 as previously discussed in connection with FIGS. 1, 2 and 3. A similar DPLL carrier recovery network associated with low priority processor 150 achieves a similar result with respect to a wideband QAM constellation.

The digital sampled binary output signal from unit 116 is applied to a demodulator 118 in a narrowband QAM high priority signal processor 119. Narrowband QAM demodulator 118 includes an input filter having an amplitude versus frequency response characteristic which substantially conforms to the shape of the amplitude versus frequency characteristic of the modulated narrowband QAM component as shown in FIG. 5. The wideband output signal from unit 117 is applied to a wideband QAM low priority signal processing network 150 which includes elements similar to those found in the narrowband QAM high priority processor. Wideband QAM low priority processor 150 includes a demodulator with an input filter having a response that substantially conforms to the shape of the amplitude versus frequency characteristic of the modulated wideband QAM component shown in FIG. 5. Thus the receiver system exhibits signal attenuating notches at frequencies associated with high energy information in a standard definition television signal.

Adaptive equalizer 120, of conventional design, receives the demodulated quadrature phased I and Q components from demodulator 118. Equalizer 120 employs an adaptive digital FIR filter to compensate for amplitude and phase irregularities, e.g., including ghosts, caused by the transmission channel. In this example adaptive equalizer 120 is a so-called fractionally spaced equalizer that is capable of sampling over more than the minimum required intervals and therefore introduces whatever phase shift and amplitude changes are needed to produce desired amplitude and phase characteristics for the output I and Q components. Equalizer 120 includes a ROM programmed with desired phase and amplitude values for the I and Q output components of equalizer 120. The output I and Q component values are respectively compared with the programmed values, and the input I, Q values are adjusted to approximate the programmed values based on the results of the comparison. The adjustment is accomplished by changing the tap weights of filters associated with equalizer 120. Equalizer 120 is capable of sub-sampling within a symbol period to produce the amount of phase and amplitude change needed to produce the desired output amplitude and phase characteristics. As a result of this ability, the operation of equalizer 120 is substantially insensitive to the phase of a clock signal applied to equalizer 120, although such phase preferably should be substantially constant. Equalizer 120 may be a synchronous equalizer, although a fractionally spaced equalizer exhibits better performance with respect to the phase characteristics of an applied clock signal. Fractionally spaced and synchronous adaptive equalizers are discussed in the text "Digital Communications", Lee and Messerschmitt (Kluwer Academic Publishers, Boston, Mass., USA, 1988).

Outputs of equalizer 120 are applied to a DPLL carrier recovery network 121, which operates as discussed in connection with FIGS. 1 and 2, for providing phase corrected sin and cos output signals to reference inputs of equalizer 120. Output signals from adaptive equalizer 120 are applied to a decoder 122, which essentially exhibits the inverse of a mapping operation performed by an encoder at the transmitter. Look-up tables are employed to "unmap" the four quadrant signal constellation into the sequential symbol segments, in binary digit form, which existed at the transmitter before being encoded at the transmitter.

Low priority wideband signal processor 150 also includes a DPLL carrier recovery network of the type discussed in connection with FIGS. 1-3, except that, compared to the DPLL in the high priority narrowband processor, different values of K1 and K2 are used. Also, each multiplex cycle encompasses four symbol clock periods due to the four times greater bandwidth and four times faster processing of the wide bandwidth information.

A signal processor 140 combines the demodulated high priority data signal from decoder 122 and the demodulated low priority data signal from processor 150. Processor 140 may include data decompression networks such as Huffman decoders and inverse quantizers, error correcting networks, and de-multiplexing and signal combining networks for providing separate audio and video television signal components. The audio component is processed by an audio signal processor 142 before being applied to a sound reproducing device 146. The video component is processed by a unit 144 to produce an image representative signal which is applied to an image display device 148.

A direct digital frequency synthesizer 129 produces a 15.36 MHz clock signal CLK in response to a master clock signal from a system clock generator 130, which also provides the master clock signal to a frequency synthesizer 135 for developing reference signals REF 1 and REF 2. The master clock signal from generator 130 is used to synchronize the operation of synthesizers 129 and 135, and exhibits a frequency of 10 MHz in this example. The frequencies of signals REF 1 and REF 2 nominally correspond to those of corresponding signals used at the transmitter. Any deviation of the frequencies of these signals from desired frequencies is compensated for as described above. Signal CLK from source 129 is the clock signal for digital signal processing circuits in low priority processor 150. The high priority narrowband processor processes a signal with a bandwidth that is one-fourth that of the wideband signal. Hence, the high priority processor elements respond to a clock signal CLK/4 with a frequency (3.84 MHz) one-fourth that of signal CLK, as provided by a frequency divider 136.

Figure 6:
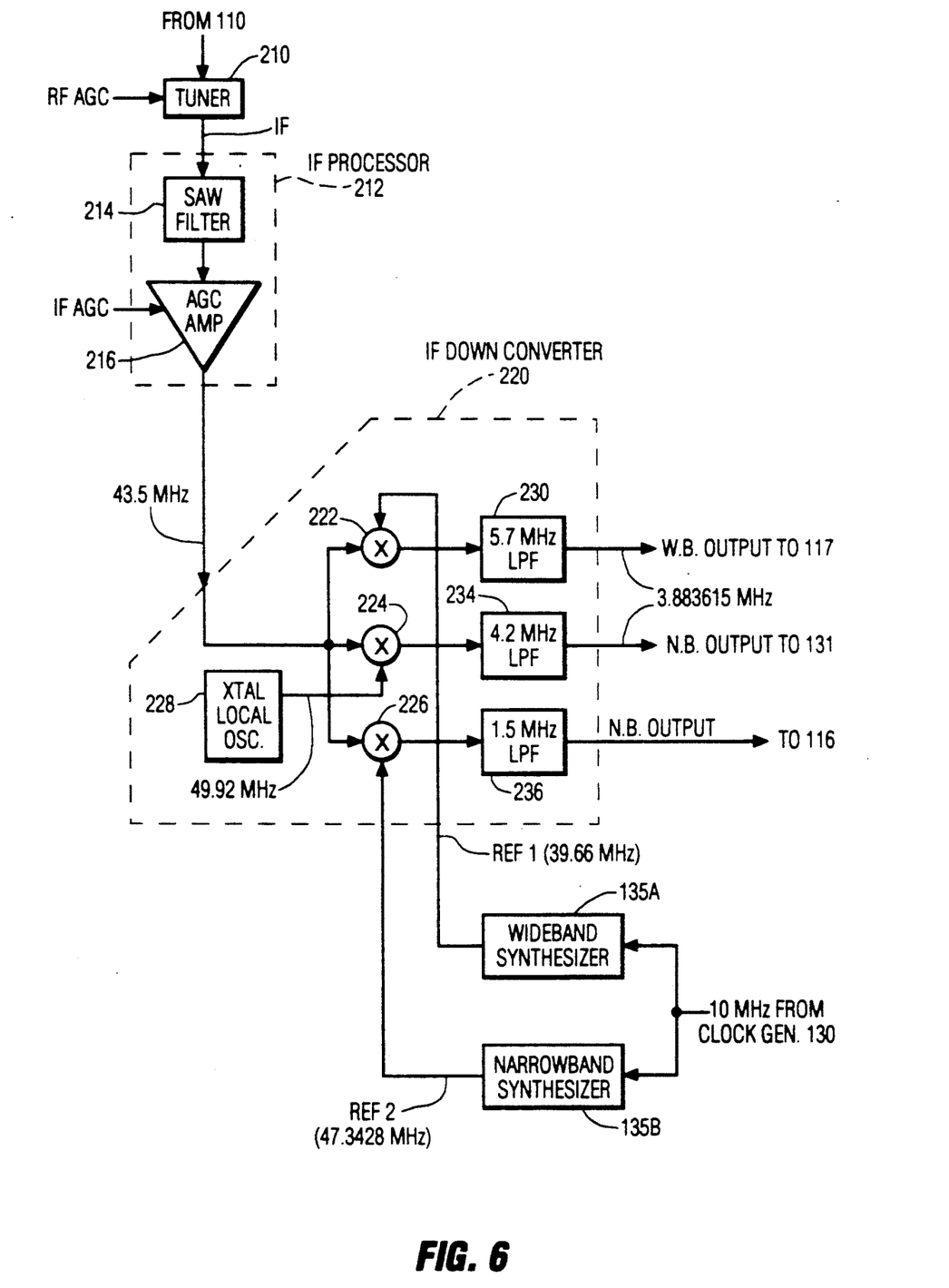
FIG. 6 shows details of an input signal processor of the system of FIG. 4.

The frequency of clock signal CLK at the receiver corresponds to the frequency of a clock signal employed at the transmitter. Establishing the proper receiver clock frequency is facilitated by developing the receiver clock signal from information contained in the more reliably received high power narrowband QAM component as will be seen in FIG. 6. For this purpose a further narrowband output signal from input processor 112, as will be seen in FIG. 6, is applied to a nonlinear signal generator 131, e.g., a power of N generator such as a multiplier that multiplies the input by itself, where N may be 2 or 4. Unit 131 produces a single frequency component at the symbol rate of the narrowband QAM component. In this case the symbol rate is 0.96 MHz, one-quarter of the bit rate. Unit 131 also produces a highly attenuated output component at the symbol rate of the low power wideband QAM component, which output component is ignored by subsequent signal processing units.

The 0.96 MHz symbol rate output component from unit 131 is bandpass filtered by a filter 132 before being applied to a phase control unit 137 including a phase detector. Filter 132 has a center frequency at the 0.96 MHz symbol frequency. The bandwidth of filter 132 is not critical, but should be sufficient to provide an adequate signal-to-noise ratio. Phase control unit 137, responsive to the 0.96 MHz symbol rate output component from filter 132, forms a phase locked loop together with a low pass filter 138, synthesizer 129 and a divide-by-16 frequency divider 139. Filter 138 removes spurious frequencies including noise produced by the operation of nonlinear signal generator 131. Frequency divider 139 receives a 15.36 MHz signal from synthesizer 129 and provides a frequency divided 0.96 MHz output signal to a control input of phase detector 137. Synthesizer 129 includes a register which accumulates phase increments determined by the signal applied to a control input of unit 129 from filter 138, at a rate determined by the frequency of the signal from clock generator 130. The accumulated phase value addresses a ROM containing sinusoidal values which synthesize the output signal from unit 129. The function of unit 129 may be implemented with integrated circuit type Q2334 commercially available from Qualcomm Corporation of San Diego, Calif.

In this system the high priority component advantageously exhibits a narrow bandwidth with small (17%) excess bandwidth and sharp out-of-band attenuation, i.e., steep "skirts". The magnitude of the output signal from a nonlinear signal generator (e.g., multiplier) such as unit 131 in response to an input QAM signal is a function of the shape of the amplitude versus frequency characteristic of the input signal, particularly at the band edges. For a given passband amplitude characteristic, a steep slope at the band edge produces a small amplitude single frequency output component at the symbol rate of the input signal, whereas a shallow band edge slope produces a large amplitude output component.

The phase locked loop including elements 137, 138, 129 and 139 coact to maintain a substantially 0° phase difference between the 0.96 MHz input signal applied to phase control 137 from units 131 and 132, and the 0.96 MHz input signal applied to phase control 137 from frequency divider 139. The latter signal is developed by synthesizer 129 in response to a phase error representative control signal from filter 138.

FIG. 6 shows details of input signal processor 112 and frequency synthesizer 135 in FIG. 4. Input signals from antenna 110 are applied to a tuner section 210 which also includes a mixer for producing an intermediate frequency (IF) output signal in accordance with known signal processing techniques. An RF amplifier within tuner 210 is gain controlled in response to an RF AGC signal. The IF output signal from tuner 210 is applied to an IF processor 212 including a SAW filter 214 having a bandwidth of approximately 6 MHz centered at 43.5 MHz, and an AGC amplifier 216 which is gain controlled in response to an IF AGC signal.

An output signal from processor 212 is applied to an IF frequency down converter 220. Converter 220 includes signal multipliers (mixers) 222, 224 and 226, output low pass filters 230, 234 and 236, and a crystal controlled 49.92 MHz local oscillator 228, all arranged as shown. Multiplier 224 responds to a reference signal from oscillator 228 and to the output signal from processor 212. Multipliers 222 and 226 also respond to the output signal from processor 212, and to reference signal REF 1 and REF 2. The latter signals are developed by wideband synthesizer component 135A and narrowband synthesizer component 135B of unit 135 in FIG. 1, in response to the 10 MHz system clock signal. An output signal from filter 234 is applied to unit 131 in FIG. 1. Frequency down converted wideband and narrowband output signals from filters 230 and 236 are provided at outputs of filters 230 and 236, respectively.

What is claimed is:

1. In a television signal receiver including a signal processing path for processing a television signal containing a carrier quadrature amplitude modulated (QAM) with symbols exhibiting a given symbol period and mapped into prescribed locations of a grid-like constellation, apparatus comprising:

means for generating a reference signal nominally at the frequency of said carrier;

input means responsive to said modulated carrier and to said reference signal for producing a processed modulated carrier;

means for generating a control signal as a function of an offset exhibited by a constellation associated with said processed carrier relative to a constellation associated with said television signal; and     means for coupling said control signal to said signal processing path for reducing said offset; wherein     said means for generating said control signal is a time multiplexed processor with plural operating modes providing a product-type output signal in at least one of said plural operating modes representative of said offset.

2. Apparatus according to claim 1, wherein said multiplexed processor exhibits a complete multiplex operating cycle within said symbol period.

3. In a television signal receiver including a signal processing path for processing a television signal containing a carrier quadrature amplitude modulated (QAM) with symbols exhibiting a given symbol period and mapped into prescribed locations of a grid-like constellation, apparatus comprising:

means for generating a reference signal nominally at the frequency of said carrier;

input means responsive to said modulated carrier and to said reference signal for producing a processed modulated carrier;

means for generating a control signal as a function of an offset exhibited by a constellation associated with said processed carrier relative to a constellation associated with said television signal; and     means for coupling said control signal to said signal processing path for reducing said offset; wherein     said means for generating said control signal is a time multiplexed processor with plural operating modes providing a product-type output signal in at least one of said plural operating modes representative of said offset, said multiplexed processor being responsive to a first signal containing a constellation of symbols at received locations, and to a second signal containing a constellation of symbols at expected locations, said output signal of said multiplexed means representing a difference between said received and expected locations.

4. Apparatus according to claim 1, wherein said television signal exhibits a spectrum wherein said quadrature amplitude modulated carrier is modulated with high priority information relative to information modulating an additional carrier in said spectrum.

5. Apparatus according to claim 1, wherein said multiplexer processor comprises a signal multiplier.

6. In a television signal receiver including a signal processing path for processing a television signal containing a carrier quadrature amplitude modulated (QAM) with symbols exhibiting a given symbol period and mapped into prescribed locations of a grid-like constellation, apparatus comprising:

means for generating a reference signal nominally at the frequency of said carrier;

input means responsive to said modulated carrier and to said reference signal for producing a processed modulated carrier;

means for generating a control signal as a function of an offset exhibited by a constellation associated with said processed carrier relative to a constellation associated with said television signal; and     means for coupling said control signal to said signal processing path for reducing said offset; wherein     said means for generating said control signal is a time multiplexed processor with plural operating modes providing a product-type output signal in at least one of said plural operating modes representative of said offset; and     said multiplexed processor comprises a signal multiplier which is multiplexed with latch means to successively perform multiplying and accumulating functions.

7. In a television signal receiver including a signal processing path for processing a television signal containing a carrier quadrature amplitude modulated (QAM) with symbols exhibiting a given symbol period and mapped into prescribed locations of a grid-like constellation, apparatus comprising:

means for generating a reference signal nominally at the frequency of said carrier but subject to exhibiting a phase or frequency offset with respect to said carrier;

input means responsive to said modulated carrier and to said reference signal for producing a processed modulated carrier;

means for generating a control signal as a function of said offset, said means for generating said control signal including a phase locked loop comprising multiplier means providing an output signal as a function of said offset in response to a first signal with symbols at received locations and to a second signal with symbols at expected locations;

means for providing timing signals to said phase locked loop for causing said phase locked loop including said multiplier means to exhibit time-multiplexed operation; and     means for coupling said control signal to said signal processing path for reducing said offset.

8. Apparatus according to claim 7, wherein said phase locked loop including said multiplier means exhibits a complete multiplex operating cycle within said symbol period.

9. Apparatus according to claim 7, wherein said control signal adjusts the phase of said reference signal.

10. Apparatus according to claim 7, wherein said television signal exhibits a spectrum including said quadrature amplitude modulated carrier modulated with high priority information relative to information modulating an additional carrier in said spectrum; and     said phase locked loop including said multiplier means exhibits a complete multiplex operating cycle within said symbol period.

11. Apparatus according to claim 10, wherein said input means comprises an adaptive equalizer.

12. Apparatus according to claim 7, wherein said phase locked loop is a second order phase locked loop.

13. In a television signal receiver including a signal processing path for processing a television signal containing a carrier quadrature amplitude modulated (QAM) with symbols exhibiting a given symbol period and mapped into prescribed locations of a grid-like constellation, apparatus comprising:
- means for generating a reference signal nominally at the frequency of said carrier but subject to exhibiting a phase of frequency offset with respect to said carrier;
- input means responsive to said modulated carrier and to said reference signal for producing a processed modulated carrier;
- means for generating a control signal as a function of said offset, said generating means including a second order phase locked loop comprising multiplier means providing an output signal as a function of said offset in response to a first signal with symbols at received locations and to a second signal with symbols at expected locations;
- means for providing timing signal to said phase locked loop for causing said phase locked loop including said multiplier means to exhibit time-multiplexed operation; and
- means for coupling said control signal to said signal processing path for reducing said offset, wherein said phase locked loop includes
- means responsive to said processed modulated carrier for selecting said symbols, said selecting means exhibiting a first signal gain factor and including memory means for generating said second signal with said symbols at expected locations.

14. Apparatus according to claim 13 and further including
- means in said phase locked loop exhibiting a second signal gain factor.

* * * * *